United States Patent [19]

Holliday et al.

[11] Patent Number: 5,472,086
[45] Date of Patent: Dec. 5, 1995

[54] ENCLOSED SEALABLE PURGIBLE SEMICONDUCTOR WAFER HOLDER

[76] Inventors: James E. Holliday, 75 "E." Watchhill Dr.; Gary M. Gallagher, 440F Autumn Ridge Cir., both of Colorado Springs, Colo. 80906

[21] Appl. No.: 209,227

[22] Filed: Mar. 11, 1994

[51] Int. Cl.⁶ ............................................. B65D 85/42
[52] U.S. Cl. ........................... 206/711; 118/500; 141/98; 206/454; 211/40; 414/217; 414/417
[58] Field of Search ................................. 206/334, 454; 211/40, 41; 414/217, 404, 417; 141/98; 118/500

[56] References Cited

U.S. PATENT DOCUMENTS

| | | |
|---|---|---|
| Re. 33,361 | 10/1990 | Coe. |
| 3,913,749 | 10/1975 | Wyers. |
| 3,918,756 | 11/1975 | Saville et al.. |
| 3,923,156 | 12/1975 | Wallestad. |
| 3,923,191 | 12/1975 | Johnson. |
| 3,926,305 | 12/1975 | Wallestad. |
| 3,939,973 | 2/1976 | Wallestad. |
| 3,961,877 | 6/1976 | Johnson. |
| 4,043,451 | 8/1977 | Johnson. |
| 4,061,228 | 12/1977 | Johnson. |
| 4,248,346 | 2/1981 | Johnson. |
| 4,450,960 | 5/1984 | Johnson. |
| 4,471,716 | 9/1984 | Milliren. |
| 4,520,925 | 6/1985 | Johnson. |
| 4,532,970 | 8/1985 | Tullis et al.. |
| 4,543,389 | 9/1985 | Tullis. |
| 4,555,024 | 11/1985 | Voss et al.. |
| 4,557,382 | 12/1985 | Johnson. |
| 4,684,021 | 8/1987 | Niebling et al.. |
| 4,718,549 | 1/1988 | Rissotti et al.. |
| 4,718,552 | 1/1988 | Rossi et al.. |
| 4,721,207 | 1/1988 | Kikuchi. |
| 4,739,882 | 4/1988 | Parikh et al.. |
| 4,747,488 | 5/1988 | Kikuchi ............................. 206/334 X |
| 4,752,007 | 6/1988 | Rossi et al.. |
| 4,793,488 | 12/1988 | Mortensen. |
| 4,815,912 | 3/1989 | Maney et al.. |
| 4,817,795 | 4/1989 | Kos. |
| 4,817,799 | 4/1989 | Gregerson et al.. |
| 4,827,110 | 5/1989 | Rossi et al.. |
| 4,833,306 | 5/1989 | Milbrett. |
| 4,872,554 | 10/1989 | Quernemoen. |
| 4,880,116 | 11/1989 | Kos. |
| 4,888,473 | 12/1989 | Rossi et al.. |
| 4,930,634 | 6/1990 | Williams et al.. |
| 4,949,848 | 8/1990 | Kos. |
| 4,966,284 | 10/1990 | Gregerson et al.. |
| 4,966,519 | 10/1990 | Davis et al.. |
| 4,995,430 | 2/1991 | Bonora et al.. |
| 5,024,329 | 6/1991 | Grohrock. |
| 5,025,926 | 6/1991 | Gregerson et al.. |
| 5,046,615 | 9/1991 | Nentl et al.. |
| 5,111,936 | 5/1992 | Kos. |
| 5,154,301 | 10/1992 | Kos. |
| 5,184,723 | 2/1993 | Karl et al.. |
| 5,207,324 | 5/1993 | Kos. |
| 5,217,053 | 6/1993 | Foster et al.. |
| 5,228,568 | 7/1993 | Ogino et al. ....................... 206/332 |
| 5,253,755 | 10/1993 | Maenke. |
| 5,255,783 | 10/1993 | Goodman et al.. |
| 5,255,797 | 10/1993 | Kos. |
| 5,295,522 | 3/1994 | DeAngelis et al. ................ 141/98 |

FOREIGN PATENT DOCUMENTS

WO9216964  10/1992  WIPO.

OTHER PUBLICATIONS

Slocum, Alexander H., "Sematech Short Course: Deterministic Machine Design Increasing Reliability and Performance", *Precision Machine Design*, Prentice Hall, Englewood Cliffs, 1992, pp. 49–64.

*Primary Examiner*—Bryon P. Gehman
*Attorney, Agent, or Firm*—Haugen and Nikolai

[57] ABSTRACT

An enclosed semiconductor wafer holder, and a cover providing isolation control of semiconductor wafers that is simple, lower cost, and non-obtrusive is described. The cover includes a sealing perimeter that creates a hermetic seal when engaged with the semiconductor wafer holder. The holder also includes a purging arrangement attached to the holder that allows an active gentle purging of inert gas into the sealed semiconductor wafer holder.

12 Claims, 4 Drawing Sheets

ENCLOSED SEALABLE PURGIBLE SEMICONDUCTOR WAFER HOLDER

BACKGROUND OF THE INVENTION

I. Field of the Invention

This invention relates generally to semiconductor wafer holders used in the storage, transportation and processing of semiconductor wafers. More particularly, it relates to a hermetically sealable purgible cassette used for containing semiconductor wafers during processing, transportation and storage.

II. Discussion of the Prior Art

Production of semiconductor wafers requires an extremely clean environment. The presence of any small particles, vapors or static discharge in the environment is damaging to the production of semiconductors, and the wafers themselves. In an effort to combat airborne particle problems, various techniques are in use today.

The most common technique in use today, is to provide a cassette for holding the semiconductor wafers which meet Semiconductor Equipment Manufacturers Institute (SEMI) standards. The SEMI standards recite specifications with the purpose of defining interchangable, standardized containers suitable for standardized processing cassettes. A standardized mechanical interface (SMIF) system has been proposed by Hewlett-Packard Company as disclosed in U.S. Pat. Nos. 4,532,970 and 4,534,389 with the purpose of reducing particle fluxes on the semiconductor wafers.

In the SMIF system, a cassette meeting SEMI standards is placed inside a clean Work In Process (WIP) box or pod. The SMIF pod or box keeps the cassette and wafers free of particles during transportation and storage. The pod or box also isolates the wafers from the operator. The semiconductor wafer cassette, the wafers, and the inside of the box or pod must all be free of particles damaging to the semiconductor manufacturing process.

The SMIF pods or boxes are used during processing in either a general clean room environment or a clean mini-environment (i.e.: under a canopy). Once in a clean environment, the SMIF boxes or pods are opened for removal of the cassette and for processing of the wafers. This can be done in a clean environment without contaminating the cassette or wafers.

To permit automated processing of the wafers, the cassette must be indexed with the process tool. An H-bar is formed on the outside of a standardized cassette, which aids in the indexing of the cassette with the process tool. However, over time the H-bar warps and does not consistently index a cassette in the same location relative to the process tool. Therefore, the H-bar is not a dependable method for attaining high repeatability in indexing the cassette to the process tool.

During automated processing, the indexing of the cassette with the process tool must be performed in a clean environment to prevent contamination. In present manufacturing systems, the SMIF pod or box must be opened and the cassette removed in such a way that requires additional process tools and steps. The increase in required steps and tools adds to the likelihood that the process tool equipment will be unable to interface with the necessary removal tools.

The increase in required steps also requires a greater cycle time to index a cassette with the process tool. Further, when using a SMIF pod or box, the loading height of the process tool equipment must be large enough to allow for the removal of the standard cassette from the box or pod. Consequently, the SMIF pods or boxes are large and heavy requiring more storage space and increasing the likelihood of carpal tunnel damage to the handlers of boxes or pods. These problems are all overcome by eliminating the need to use SMIF boxes or pods. Elimination of the boxes or pods also reduces the amount of necessary clean-up, thereby further reducing the cost of processing semiconductor wafers.

The present invention overcomes the disadvantages of the current manufacturing system by providing a hermetically sealed cassette that can be purged with an inert gas. This sealed cassette may be indexed directly onto the process tool, eliminating the following steps: opening the SMIF box or pod, lowering the pod or box door simultaneously with the cassette, and manipulating the cassette onto the process tool. The hermetically sealed cassette has one surface of a three-groove kinematic coupling to positively locate the cassette with the process tool. This coupling provides a dependable method to position the cassette relative to the process tool with a high rate of repeatability.

Further, the cassette is smaller and about 20% to 50% lighter than the SMIF box or pod. Hence, there is a reduced likelihood that handlers will suffer from carpal tunnel. The reduced size eliminates the need that loading height of the process tool equipment be large enough for the removal of the standard cassette from a SMIF box or pod. Also, the required storage, transportation, and positioning space are reduced. A tracking system provided on the outer surface of the hermetically sealed cassette allows the cassette to be tracked in an unfriendly external environment during the transportation, storage or processing of the semiconductor wafers.

SUMMARY OF THE INVENTION

The purpose of the present invention is to provide a sealable, purgible, cassette that is compatible with SEMI standards. The cassette has at least one open end, a cover with a means for sealing the open end of the cassette, a means for supporting the semiconductor wafer's within the cassette, a means for purging the cassette, a means for precisely indexing the cassette relative to processing equipment and a means for tracking the cassette. The cover when engaged forms a hermetic seal with the cassette. The cassette is designed to securely support semiconductor wafer's within the sealed cassette. The hermetically sealed cassette allows direct indexing to semiconductor wafer processing equipment without the influence of external factors on the contents of the container. The means for precisely indexing the cassette relative to processing equipment provides a dependable method of indexing the cassette to the process tool. The means for precisely indexing the cassette positions the cassette relative to the process tool in a precise manner with a high rate of repeatability. When sealed, the means for purging the cassette allows a small volume of inert gas to be slowly purged into the cassette, providing a clean environment for the semiconductor wafers. Means for tracking the cassette is provided for tracking the cassette without the need for a clean external environment.

It is accordingly a principal object of the present invention to provide a hermetically sealed cassette which meets SEMI standards.

Another object of the present invention is to provide a simple flexible, low-cost, non-obtrusive cassette for semiconductor wafers, that allows isolation control.

Another object of the present invention is to provide a purgible cassette.

Another object of the present invention is to provide a cassette that can be directly indexed with a process tool in a mini-clean environment reducing the cycle time to process a semiconductor wafers.

Another object of the present invention is to provide a directly indexable cassette having a means to positively index the cassette relative to the process tool with a high rate of repeatability.

Still another object of the present invention is to provide a cassette that can reduce the number of process tools and steps for semiconductor wafer processing.

A further object of the present invention is to provide a cassette that enhances reliability during wafer processing by eliminating the need for SMIF boxes or pods, large clean rooms, and the additional processing steps that the use of boxes or pods requires.

Yet another object of the present invention is to provide a cassette that reduces the overall weight and size of the package used to store and transport the semiconductor wafers in a clean environment.

Another object of the present invention is to provide a cassette with a tracking system that can be implemented outside of a clean environment.

These and other objects, as well as the features and advantages of the present invention, will be readily apparent to those skilled in the art from a review of the following detailed descriptions of the preferred embodiment in conjunction with the accompanying drawings and claims.

DESCRIPTION OF THE DRAWINGS

FIG. 3I is a cross-sectional view through line I—I of FIG. 3.

FIG. 4II is a cross-sectional view through line B—B of FIG. 4, with the cover and bottom elevated from the cassette.

DETAILED DESCRIPTION OF THE PREFERRED EMBODIMENT

Figure 1:
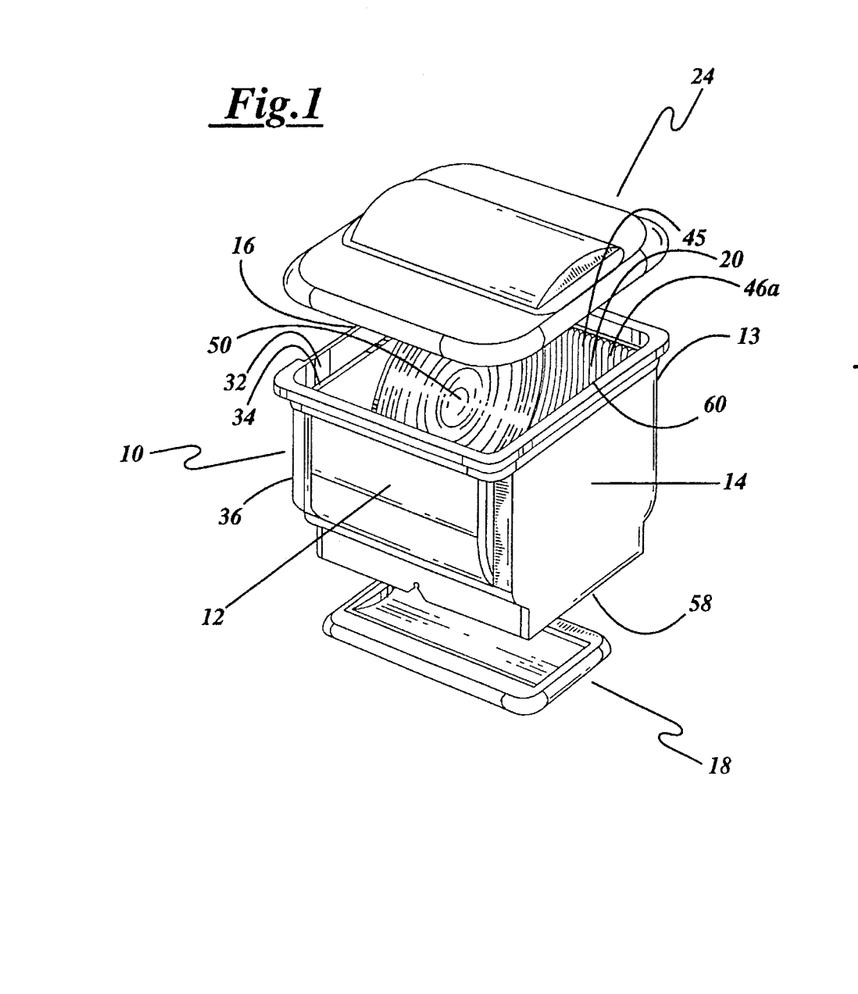
FIG. 1 is a perspective view of the cassette with the cover and optional bottom aligned with the cassette.

Referring first to FIG. 1, there is indicated generally the sealable semiconductor wafer cassette 10, a cassette cover 24, a wafer 50, and an optional cassette bottom door 18.

The semiconductor wafer cassette 10 has a pair of opposing side walls 12 and 13, a pair of endwalls 14 and 16, an open top 20, and an optional open bottom 58. The cassette cover 24 is designed to close and seal the open top 20. The bottom door 18 is designed to close and seal the optional open bottom 58.

Figure 2:
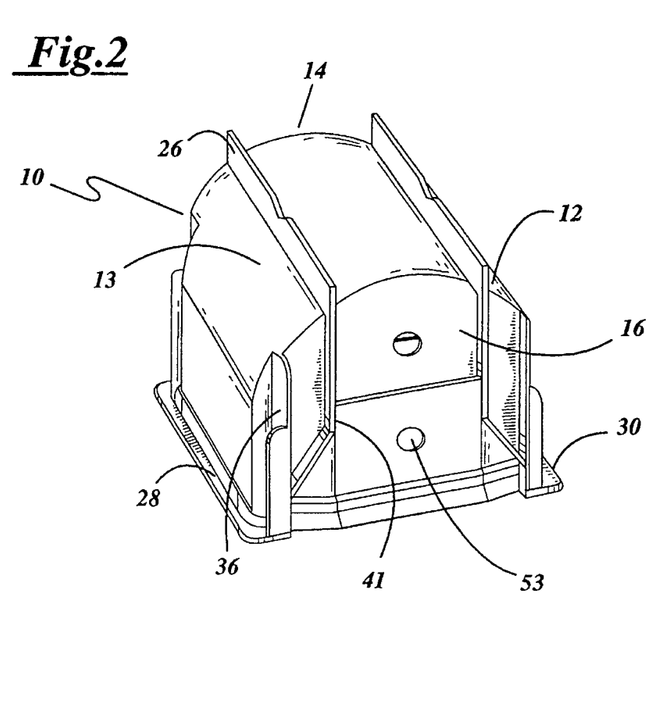
FIG. 2 is a perspective view of the semi-standard cassette showing an enclosed bottom and the H-bar side.
Figure 3:
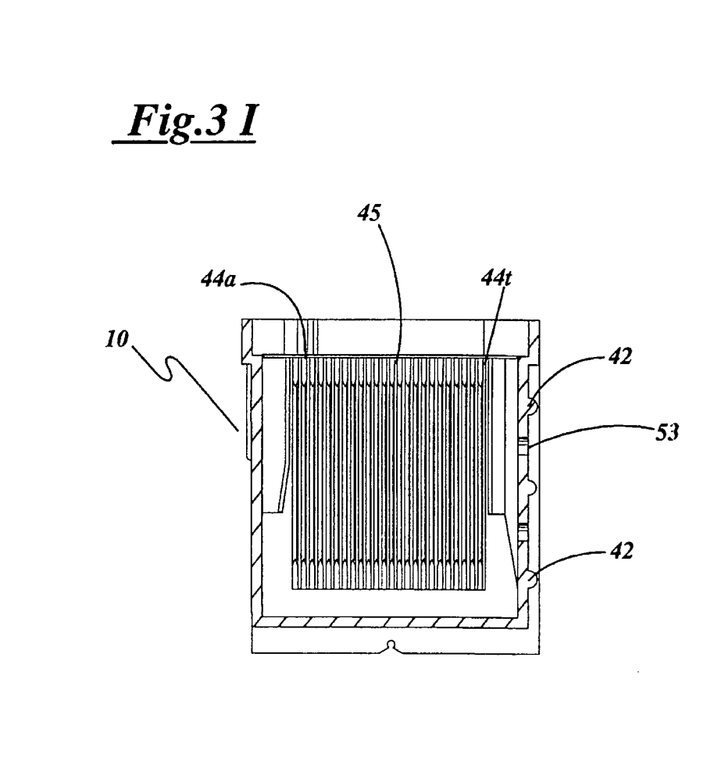
FIG. 3 is a sectional view of the cassette of the type shown in FIG. 2, showing the inner side of the H-bar, with the alternate preferred indexing spheres shown.

Referring to FIGS. 2 and 3 the curved semiconductor wafer supporting sidewalls 12 and 13 extend downward from the two opposing perimeter lip edges 28 and 30 to the cassette bottom frame 26. On the inner surface of the curved semiconductor wafer supporting side walls 12 and 13 are a plurality of recess pairs 44a–t and 46a–t shaped like saw teeth with the apex of each recess pair aligned on opposing interior surfaces, best shown in FIGS. 1 and 3I. Each recess pair forms a slot 45, providing a supporting surface for the semiconductor wafers 50 in perimeter contact with the lower portion of the curved sides 12 and 13. The inside of the optional bottom door 18 may be recessed to form a continuous support surface to the wafers 50 (see FIGS. 1 and 4). The cassette may be constructed with a varying number of recess pairs, of course, without deviating from the invention.

Figure 7:
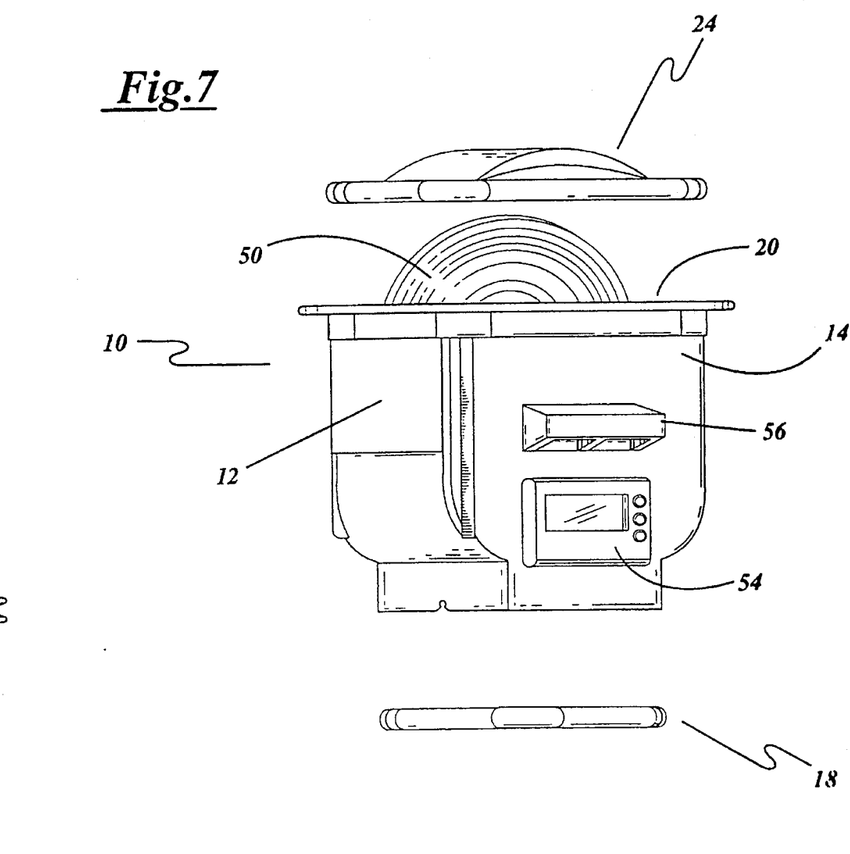
FIG. 7 is a perspective view of the cassette, showing the cover and optional bottom aligned with the cassette, a semi conductor wafer partially extending into the cassette and the optional handle and means for tracking, affixed to an end of the cassette.

Forming the enclosed ends of the semiconductor wafer cassette 10 are the end walls 14 and 16. The end wall 14 forming an enclosed end of the semiconductor wafer cassette 10 has an optional processing handle 56 which extends relatively perpendicular to the end wall 14 and relatively parallel to the open top 20 (see FIG. 7). The cassette processing handle 56 forms a gripping surface. Also, attached to the end wall 14 is the optional cassette level tracking system 54, allowing a semiconductor wafer cassette 10 to be tracked during processing, transportation, and storage. Several types of tracking systems may be used including but not limited to: infrared encoders, radio frequency transmitters, and bar codes that interact with bar code readers.

Opposite the end wall 14 is the H-bar end 16 that forms the other enclosed end of the semiconductor wafer cassette 10 (See FIG. 2). An H-bar 41 extends from the surface of the H-bar end that allows the cassette 10 to be indexed with the processing tool. Referring to FIGS. 3 and 3I an optional plurality of partial spheres 42 may extend from the H-bar end 16 allowing precise, consistent and reliable indexing. The optional partial spheres 42 form one surface of a three groove kinematic coupling.

A three groove kinematic coupling consists of two surfaces. Three spheres arranged to form a triangle are attached to one surface and three grooves, designed to align and engage the spheres, are formed within the other surface. The two surfaces are brought into contact. The spheres engage with the grooves, precisely orienting the two surfaces relative to the other. This coupling arrangement allows repeatability of the precise orientation on the order of the surface finish of the spheres and grooves. The preferred material for the spheres and grooves is a hard ceramic such as tungsten carbide, silicon nitride or zirconia. Of course other materials may also be used without deviating from the invention. Either the grooves or spheres may extend from the H-bar endwall 16, to form one surface of the kinematic coupling surface 42. The other surface is formed on the process tool. This arrangement allows precise orientation between the cassette and the process tool. In the alternate preferred embodiment, the partial spheres 42 of the kinematic coupling may replace the H-bar 41.

Purging bores 53 extend through the H-bar end 16 at predetermined locations. A means for purging the cassette 10 consisting of a plurality of self sealing breather filters may extend from the end wall 16 centered over the purging bores 53, allowing the sealed semiconductor wafer cassette 10 to be purged with particle-free air or an inert gas. In the preferred embodiment, a 0.02 micron filter polytetrafluoroethylene (PTFE) membrane is used. These filters may be sealed within a housing that in turn extends through and seals with the purging bore 53. Other suitable mechanisms can, of course, be used without deviating from the invention. The purging bores 53, optional handle 56, purging means, and means for tracking 54 may alternatively be attached to the cover 24 or bottom 18 of the semiconductor wafer cassette without deviating from the invention.

Referring again to FIGS. 1 and 3, the open top 20 is formed by a perimeter lip 60, a perimeter shoulder 32 that extends perpendicularly downward from an inner edge of lip 60, and a ledge 34 that extends perpendicularly inward from the perimeter shoulder 32. The perimeter shoulder 32 and ledge 34 forms a first means for sealing the open end of the cassette 10 (see FIG. 4). The perimeter lip 60 provides a support surface for stacking an inverted cassette that is compatable with SEMI standards.

Figure 4:
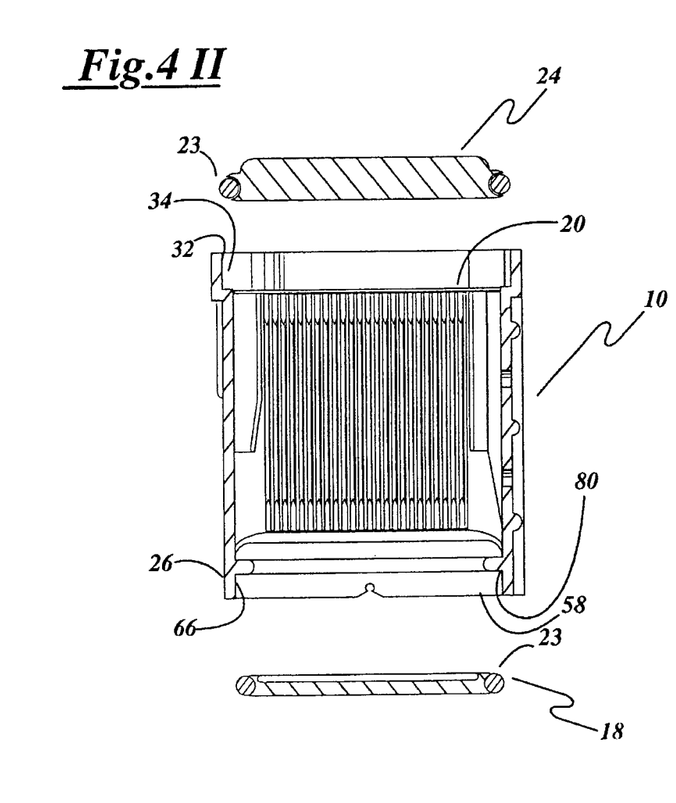
FIG. 4 is a sectional view of the cassette of the type shown in FIG. 1, with the cover and optional bottom engaged and a wafer positioned within the cassette.
Figure 5:
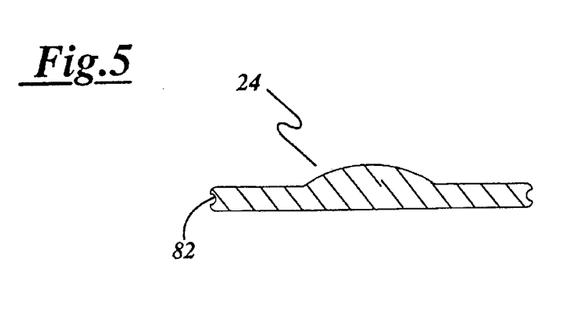
FIG. 5 is a sectional end view of the cover of the type shown in FIG. 1, with the seal removed.
Figure 6:
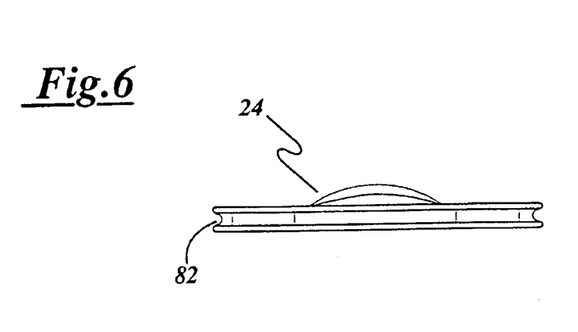
FIG. 6 is an end view of the cover of the type shown in FIG. 1, with the seal removed.

Referring to FIGS. 4, 4II, 5, and 6 the cassette cover 24 is designed to close and seal the open top 20. Recessed around the perimeter of the cover 24 is a groove 82 that engages with a seal 23. The seal 23, preferably made of collapsable elastomer, forms a second means for sealing the open end of the cassette 10. Of course the seal 23 may be made of other acceptable materials such as plastic or rubber without deviating from the invention. When engaged, the cover 24 rests on the cassette perimeter ledge 34. Engaging the cover 24 with the semiconductor wafer cassette open end 20 engages the first and second means for sealing, thereby creating a hermetic seal.

Without limitation, the cover may be constructed with a thickness about the same as the perimeter shoulder 32 so that when the cover 24 engages with the cassette 10, a relatively flat top surface is formed. The cover may also have a means for supporting the semiconductor wafers. This means for support may be positioned to align with the apex of each recess pair when the cover is engaged with the container. These supports would prevent movement of the wafer during transportation. The cover may be constructed to engage with other surfaces of the cassette, while still forming a hermetic seal without deviating from the invention.

The present invention may be constructed with an enclosed bottom or with an open sealable bottom 58. In a cassette 10 with an open sealable bottom 58, cassette bottom inner shoulder 66 extends around the inside of the optional cassette bottom frame 26, forming a third sealing surface. The optional bottom door 18 has a seal 23 extending around the perimeter, forming a fourth sealing surface. When the bottom door 18 is engaged with the semiconductor wafer cassette bottom inner shoulder 66, a hermetic seal is created between the third and fourth means for sealing. When engaged, the bottom 18 rests on the cassette bottom perimeter ledge 80.

Best shown in FIGS. 1 and 2 are four vertical edges 36 that form the corners of the semiconductor wafer cassette 10, providing rigidity and support to the cassette. The vertical edges 36 extend upward from the lower portion of each end of the curved sides 12 to the perimeter ledge 34.

Having described the constructional features of the sealable, purgible semiconductor wafer cassette 10, the mode of use will now be discussed. With a sealed clean cassette containing semiconductor wafers, the operator of the wafer processing equipment indexes the sealed semiconductor wafer cassette 10 directly onto the processing tool. To control the particles on the exterior surface of the integrated cassette 10, the processing equipment should provide a mini-environment that allows a slight overpressure within the mini-environment to prevent the exterior environment from entering into the clean mini-environment. The mini-environment must also provide good air flow to the processing tool.

The cassette 10 may be indexed horizontally or vertically, depending on the preferred cassette orientation. Then, a processing tool with a suction and vacuum capability aligns and engages the cassette cover 24. The hermetic seal collapses allowing the process tool to remove the cover 24. Next, all the desired processes may be performed on the semiconductor wafers within the cassette. After all the desired processes have been performed, the cover 24 is then resealed by engaging the cover 24 with the cassette's perimeter ledge 34, discontinuing the vacuum and disengaging the suction. A hermetic seal is formed between the perimeter shoulder 32, the ledge 34 and the cover's seal 23.

The cassette may then be transported to other process stations, stored or otherwise transported. During storage, the cassette may be purged with an inert gas utilizing two 0.02 micron filter PTFE membranes providing a clean environment for semiconductor wafers 50. When the active purge is removed, the sealed cassette 10 will maintain the inert gas purge for several hours. This method allows the semiconductor wafers to be safely stored and transported in an unfriendly external environment. Also, during processing, transportation or storage, the optional tracking system 54 may be used to track the cassette in an external environment. The optional handle 56 on the endwall 14 of the cassette 10 facilitates loading and unloading a cassette into process equipment and storage areas.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed:

1. An enclosure directly indexible to a process tool for securely containing semiconductor wafers, comprising:
   (a) a container having an open end, a lip extending around a perimeter of said open end, and a first means for sealing the open end of the container integral with the open end:
   (b) means for supporting semiconductor wafers within said container: said means for supporting being integrally formed with said container:
   (c) a cover which is positionable to close the open end of the container, said cover having a recess extending inward from a perimeter of said cover and a flexible seal retained by said recess, said flexible seal cooperating with the first means for sealing the open end of said container to seal the open end of said container when the cover is engaged with the open end; and
   (d) a side of said container having a purging bore adapted to receive and seal with a means for purging the enclosure.

2. An enclosure directly indexible with a process tool, for securely containing semiconductor wafers, comprising:

(a) a container having an open end, a lip extending around a perimeter of said open end, and a shoulder integral with the open (b) means for supporting semiconductor wafers within said container, said means for supporting being integrally formed with said container:

(c) a cover positionable to close the open end of said container;

(d) a flexible seal attached to and projecting outwardly from said cover to engage said shoulder of said container to form a hermetic seal between said shoulder and said flexible seal when said cover is positioned to close the open end of said container; and (e) a side of said container having a purging bore adapted to receive and seal with a means for purging the enclosure.

3. An enclosure .directly indexible with a process tool for securely containing semiconductor wafers, comprising:

(a) a box having a first open end, a second open end, two enclosed sides, two enclosed ends, a lip extending around a perimeter of the first open end, a first shoulder integral with the first open end, and a second shoulder integral with the second open (b) means for supporting semiconductor wafers within said box;

(c) a cover positionable to close the first open end of said box, said cover including a means for sealing the first open end of the box, said means for sealing the first open end being engagable with said first shoulder when said cover is positioned to close the first open end of said box;

(d) a door positionable to close the second open end of the box, said door including a means for sealing the second open end of the box, said means for sealing the second open end being engagable with said second shoulder when said door is positioned to close the second open end of said box: and (e) a side of said box having a purging bore adapted to receive and seal with a means for purging the enclosure.

4. An enclosure directly indexible with a process tool for securely containing semiconductor wafers, comprising:

(a) a container having an open end, a lip extending around a perimeter of said open end, and a means for sealing the open end of the container integral with the open end:

(b) means for supporting a plurality of semiconductor wafers within said container, including a plurality of recess pairs with an apex of each recess pair aligned on opposing interior surfaces of said container, said recess pairs forming a plurality of slots in which semiconductor wafers are received:

(c) a cover for the open end of the container, said cover including a perimeter having a recess extending inward from said perimeter and a flexible seal retained by said recess:

(d) said container having a purging bore adapted to receive and seal with a means for purging the enclosure: and (e) a means for tracking said enclosure affixed to said enclosure.

5. An enclosure as recited in claim 4 in which said cover further comprises a means for supporting semiconductor wafers, wherein said means for supporting is positioned on said cover to align with said slots when said cover is engaged with the container.

6. An enclosure directly indexible with a process tool for securely containing semiconductor wafers, comprising:

(a) a container having an open end, a lip extending around a perimeter of the open end, and a shoulder integral with the open end;

(b) means for supporting a plurality of semiconductor within the container including a plurality of recess pairs, having an apex of each recess pair aligned on opposing interior surfaces of said container, said recess pairs forming a plurality of slots in which semiconductor wafers are received;

(c) a cover positionable to close the open end of the container, said cover including a flexible seal that engages with said shoulder of said container to form a hermetic seal between said cover and said container when said cover is positioned to close the open end of said container;

(d) a side of said container having a purging bore adapted to receive and seal with a means for purging the enclosure; and (e) a means for tracking the location of said enclosure.

7. An enclosure directly indexible with a process tool for securely containing semiconductor wafers, comprising:

(a) a box having a first open end, a sidewall, a second open end, a first shoulder integral with the sidewall adjacent said first open end, and a second shoulder integral with said sidewall adjacent said second open end, and a purging bore in the sidewall adapted to receive and seal with a means for purging the enclosure:

(b) means for supporting a plurality of semiconductor wafers within said box, said means for supporting including a plurality of recess pairs with an apex of each recess pair aligned on opposing interior surfaces of said box, said recess pairs forming a plurality of slots in which said semiconductor wafers are received:

(c) a cover positionable to close the first open end of the box, said cover including a means for sealing the open end of the box engagable with said first shoulder:

(d) a means for tracking the location of said box affixed to an outside surface of said enclosure when said cover is engaged; and (e) a door positionable to close the second open end of said box, said door including an outwardly extending flexible seal that engages with said second shoulder of the box to form a hermetic seal between the door and the box when said door is positioned to close the second open end of said box.

8. A box directly indexible with a process tool for securely containing semiconductor wafers, comprising:

(a) a semiconductor wafer cassette having an open end, a lip extending around a perimeter of said open end, and a means, integral with the open end, for sealing the open end of the semiconductor wafer cassette:

(b) means for precisely indexing the semiconductor wafer cassette relative to a processing equipment:

(c) means for supporting a plurality of semiconductor wafers within said semiconductor wafer cassette, including a plurality of recess pairs with an apex of each of said recess pairs aligned on opposing interior surfaces of said semiconductor wafer cassette, said recess pairs forming a plurality of slots in which semiconductor wafers are received;

(d) a cover positionable to close the open end of the semiconductor wafer cassette, said cover having a recess extending inward from a perimeter of said cover and a flexible seal retained by said recess, said flexible seal cooperating with the means for sealing the open end to seal the open end of said semiconductor wafer cassette when the cover is engaged with the semiconductor wafer cassette;

(e) a side of said semiconductor wafer cassette having a purging bore adapted to receive and seal with a means for purging the box: and (f) means for tracking said box engaged with an outside surface of said box when said cover is engaged.

9. A box as recited in claim 8 in which said cover further comprises a means for supporting semiconductor wafers, wherein said means for supporting is positioned on said cover to align with said slots when the cover is engaged with the box.

10. A box directly indexible with a process tool for securely containing semiconductor wafers, comprising:

(a) a semiconductor wafer cassette having an open end, a lip extending around a perimeter of said open end, and a shoulder integral with the open end;

(b) means for precisely indexing the semiconductor wafer cassette relative to a processing equipment;

(c) means for supporting semiconductor wafers within said semiconductor wafer cassette, including a plurality of recess pairs with an apex of each of said recess pairs aligned on opposing interior surfaces of said semiconductor wafer cassette, said recess pairs forming a plurality of slots to support semiconductor wafers;

(d) a cover positionable to close the open end of the semiconductor wafer cassette;

(e) a flexible seal attached to and projecting outwardly from said cover to engage said shoulder of said semiconductor wafer cassette to form a hermetic seal between said shoulder and said flexible seal when said cover is positioned to close the open end of said semiconductor wafer cassette;

(f) a side of said semiconductor wafer cassette having a purging bore adapted to receive and seal with a means for purging the box; and (g) a means for tracking said box engaged with an outside surface of said box when said cover is engaged.

11. A box directly indexible with a process tool for securely containing semiconductor wafers, comprising:

(a) a semiconductor wafer cassette having an open end, a lip extending around a perimeter of said open end, and a first means for sealing the open end of the semiconductor wafer cassette being integral with the open end of said semiconductor wafer cassette:

(b) means for precisely indexing the semiconductor wafer cassette relative to a processing equipment;

(c) means for supporting a plurality of semiconductor wafers within said semiconductor wafer cassette, including a plurality of recess pairs with an apex of each of said recess pairs aligned on opposing interior surfaces of said semiconductor wafer cassette, said recess pairs forming a plurality of slots to support semiconductor wafers:

(d) a cover including a second means for sealing the open end of the semiconductor wafer cassette, engagable with said first means for sealing, thereby creating a hermetic seal;

(e) a side of said semiconductor wafer cassette having a purging bore adapted to receive and seal with a means for purging the box;

(f) a means for tracking said box engaged with an outside surface of said box when said cover is engaged: and (g) said semiconductor wafer cassette further includes a second open end with a shoulder, said shoulder being integral with said second open end; and (h) a door, said door including a flexible seal for sealing the second open end of the semiconductor wafer cassette, said flexible seal engages with said shoulder forming a hermetic seal when said door is positioned to close the second open end of the semiconductor wafer cassette.

12. A box directly indexible with a process tool for securely containing semiconductor wafers, comprising:

(a) a semiconductor wafer cassette having an open end, a lip extending around a perimeter of said open end, and a first means for sealing the open end of the container integral with the open end of said semiconductor wafer cassette:

(b) at least three partial spheres extending from said semiconductor wafer cassette to form one surface of a three-groove kinematic coupling;

(c) means for supporting a plurality of semiconductor wafers within said semiconductor wafer cassette, including a plurality of recess pairs with an apex of each of said recess pairs aligned on opposing interior surfaces of said semiconductor wafer cassette, said recess pairs forming a plurality of slots to support semiconductor wafers:

(d) a cover including a second means for sealing the open end of the semiconductor wafer cassette engagable with said first means for sealing; thereby creating a hermetic seal when the cover is engaged with the semiconductor wafer cassette:

(e) said semiconductor wafer cassette having a purging bore adapted to receive and seal with a means for purging the box; and (f) a means for tracking said semiconductor wafer cassette, engaged with an outside surface of said box when said cover is engaged.

* * * * *

UNITED STATES PATENT AND TRADEMARK OFFICE
CERTIFICATE OF CORRECTION

PATENT NO. : 5,472,086
DATED : December 5, 1995
INVENTOR(S) : James E. Holliday, Gary M. Gallagher It is certified that error appears in the above-indentified patent and that said Letters Patent is hereby corrected as shown below:

Claim 2, column 7, paragraph(a), line 4, after "with the open", insert --end;--

Claim 3, column 7, paragraph(a), line 25, after "with the second open" insert --end;--

Claim 12, column 10, paragraph(d), line 46, change ";" to --,--

Signed and Sealed this

Ninth Day of July, 1996

Attest:

BRUCE LEHMAN

*Attesting Officer*  *Commissioner of Patents and Trademarks*